(12) United States Patent
Kamikubo

(10) Patent No.: US 6,794,267 B2
(45) Date of Patent: Sep. 21, 2004

(54) PROCESS OF MANUFACTURING SEMICONDUCTOR DEVICE

(75) Inventor: Noritaka Kamikubo, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 151 days.

(21) Appl. No.: 10/062,543

(22) Filed: Feb. 5, 2002

(65) Prior Publication Data

US 2002/0115295 A1 Aug. 22, 2002

(30) Foreign Application Priority Data

Feb. 22, 2001 (JP) .................................. 2001-046197

(51) Int. Cl.⁷ .......................................... H01L 21/4763
(52) U.S. Cl. ......................................... 438/427; 438/645
(58) Field of Search ........................... 438/427, 618, 438/634, 645, 692

(56) References Cited

U.S. PATENT DOCUMENTS 6,127,262 A * 10/2000 Huang et al. .............. 438/634
6,372,605 B1 * 4/2002 Kuehne et al. ............ 438/427

FOREIGN PATENT DOCUMENTS

| JP | 09-139366 | 5/1997 |
| JP | 10-113859 | 5/1998 |
| JP | 11-233466 | 8/1999 |

* cited by examiner

Primary Examiner—(Vikki) Long Pham
Assistant Examiner—Hoa B. Trinh
(74) Attorney, Agent, or Firm—Nixon & Vanderhye P.C.

(57) ABSTRACT

A process of manufacturing a semiconductor device comprising the step of chemical mechanical polishing for flattening an interlayer insulating film deposited on a wafer on which desired elements are in advance formed, wherein a stopper layer is formed on a region which will be excessively polished through the chemical mechanical polishing before or after forming the interlayer insulating film.

14 Claims, 5 Drawing Sheets

US 6,794,267 B2

PROCESS OF MANUFACTURING SEMICONDUCTOR DEVICE

CROSS-REFERENCE TO RELATED APPLICATION

This application is related to Japanese application No. 2001-46197 filed on Feb. 22, 2001, whose priority is claimed under 35 USC § 119, the disclosure of which is incorporated by reference in its entirety.

BACKGROUND OF THE INVENTION

1. Field of the Invention

The present invention relates to a process of manufacturing a semiconductor device. More particularly, it relates to a process for solving a problem in that the polish rate (=polished amount/unit time) of an interlayer insulating film during chemical mechanical polishing is extremely high in a wafer periphery portion.

2. Description of Related Art

In accordance with integration at higher level and increase in capacity of integrated circuit devices, a wiring structure of semiconductor devices is getting to be miniaturized and multilayered. Accordingly, a process of forming an interwire insulating film or an interwire plug of greater flatness has been demanded. For obtaining such an interwire insulating film or an interwire plug of greater flatness, widely employed is a process of flattening an interlayer insulating film by chemical mechanical polishing (hereinafter abbreviated as CMP), forming connection holes by photolithography and dry etching, depositing metal such as tungsten to fill the connection holes and removing the metal on the interlayer insulating film by CMP.

It is generally known that a film to be polished, such as an interlayer insulating film or the like, is deposited at the deposition amount varying over the wafer surface. FIG. 4 shows the variation of the deposition amount among portions of the wafer surface, wherein A is a center portion, C is an edge portion and B is an intermediate portion between A and C. Type 1 shows a film deposited at the deposition amount decreasing from A to C, type 2 shows a film deposited at the deposition amount decreasing from A to B and increasing from B to C, type 3 shows a film deposited at the deposition amount increasing from A to C, and type 4 shows a film deposited at the deposition amount increasing from A to B and decreasing from B to C. The variation in deposition amount depends on the deposition rate.

As shown in FIG. 3, in the CMP step, a wafer periphery portion of about 1–2 mm width from a wafer edge is polished at the polish rate twice or more as great as that of a central portion ranging from a point of about 3 mm from the wafer edge to a wafer center. Accordingly, in polishing the film deposited at the deposition amount of type 1 or 4 shown in FIG. 4, there is a problem in that the film may excessively be polished at the wafer periphery portion.

FIGS. 6(a) to 6(d) are sections illustrating the steps of manufacturing a conventional semiconductor device. Referring to FIG. 6(a), a first insulating film 103 made of a BPSG film is formed by chemical vapor deposition (CVD) on a substrate 101 on which desired semiconductor devices are formed and the surface of the first insulating film is flattened by CMP. A lower wiring layer 104 is then formed on the first insulating film 103 and a second interlayer insulating film 105 made of a TEOS film is deposited thereon by CVD.

The first insulating film 103 is deposited at the deposition amount of type 2 or 3 mentioned above and is almost flattened by the following CMP.

The second interlayer insulating film 105 is deposited at the deposition amount of type 1 or 4. A thickness of the second interlayer insulating film 105 at a wafer edge 109 is smaller than that of the other portion.

Then, the second interlayer insulating film 105 is flattened by CMP as shown in FIG. 6(b).

Photolithography and dry etching are carried out to form a connection hole 106 and a conductive film 107 such as a tungsten film is deposited on the entire surface of the wafer by CVD as shown in FIG. 6(c). Before depositing the conductive film 107, a TiN/Ti layer (not shown) is formed by sputtering for improving the adhesion to the underlying layer.

Then, as shown in FIG. 6(d), the conductive film 107 on the second interlayer insulating film 105 is removed by CMP while leaving the conductive film 107 only in the connection hole 106, thereby forming a plug 108.

According to the process, the second interlayer insulating film 105 in the neighborhood of the wafer edge 109 is polished at an extremely high polish rate during CMP, thereby the thickness of the second interlayer insulating film 105 in the neighborhood of the wafer edge 109 is reduced as shown in FIG. 6(b).

On the other hand, FIGS. 7(a) and 7(b) show the steps of manufacturing another conventional semiconductor device. As shown in FIG. 7(a), a first interlayer insulating film 114 is deposited by CVD on a substrate 113 on which desired semiconductor devices are formed and then flattened by CMP. The first interlayer insulating film 114 is deposited at the deposition amount of type 1 or 4 shown in FIG. 4 and thus its thickness in the neighborhood of a wafer edge 115 is small.

Then, as shown in FIG. 7(b), the first interlayer insulating film 114 is flattened by CMP before forming a wiring layer.

According to the process, the first interlayer insulating film 114 has a small thickness in the neighborhood of the wafer edge 115 as shown in FIG. 7(a). Since the CMP is carried out at the polish rate extremely high in a wafer periphery portion of about 1–3 mm width from the wafer edge as shown in FIG. 2, the substrate 115 in the neighborhood of the wafer edge is also polished, which is not preferable.

As a solution for the extremely high polish rate in the neighborhood of the wafer edge, for example, Japanese Unexamined Patent Publication No. Hei 9 (1997)-139366 describes a technique for providing a retainer ring, a part of a wafer retaining member, with a rounded section at its circumference or an adjusted height to prevent extreme polishing in the wafer periphery portion, thereby maintaining an appropriate polish rate to obtain a flat surface.

However, even by the above technique, secondary deformation 122 in a polish cloth 121 contacting the neighborhood of a wafer edge 120 as shown in FIG. 8 is unavoidable, which causes a repulsion force 123 to the neighborhood of the wafer edge 120. Thus, it is impossible to inhibit the extremely high polish rate in the neighborhood of the wafer edge 120. In FIG. 8, reference numeral 124 denotes the retainer ring, 125 a wafer and 126 an insert pad.

In the step of forming the interwire plugs, the conductive film 107 is deposited on the second interlayer insulating film 105 as shown in FIG. 6(c) and then removed by CMP. However, since the second interlayer insulating film 105 has been polished at an extremely high polish rate in a wafer periphery portion 110, the conductive film 107 is not completely removed from the wafer periphery portion 110 and remains there as indicated by a reference numeral 111. Thus, an undesired object is left on the wafer.

On the other hand, in the step of forming the interlayer insulating film on a transistor, the substrate 113 itself is also polished during the flattening of the first interlayer insulating film 114 as shown in FIG. 7(*b*), which may generate an undesired object on the wafer.

SUMMARY OF THE INVENTION

In view of the above circumstances, the present invention provides a process of manufacturing a semiconductor device capable of preventing the generation of the undesired object after CMP.

According to the present invention, provided is a process of manufacturing a semiconductor device comprising the step of chemical mechanical polishing for flattening an interlayer insulating film deposited on a wafer on which desired elements are in advance formed, wherein a stopper layer is formed on a region which will be excessively polished through the chemical mechanical polishing before or after forming the interlayer insulating film.

According to the process of the present invention, the stopper layer is provided in advance on the region which will be excessively polished. Therefore, uniformity in thickness of the interlayer insulating film between the wafer periphery portion and other portion is improved, which allows the manufacture of a favorable semiconductor device.

Since the flatness of the interlayer insulating film improves, a wiring material to be filled in a connection hole for connecting wiring layers is prevented from remaining in a step difference portion in the wafer periphery portion.

It is preferred that the stopper layer has a thickness greater than an intended thickness of the interlayer insulating film to be obtained after the polishing by a thickness of the interlayer insulating film reduced by the polishing.

According to this feature, the stopper layer will not be removed from the region which will be excessively polished even after the polishing of the interlayer insulating film.

Further, it is preferred that the stopper layer has a width greater than a width greater than that of a resist layer to be removed from the wafer periphery portion in the photolithography step.

According to this feature, the excessive polishing in the wafer periphery portion is surely prevented.

Further, the stopper layer is preferably a silicon nitride film.

According to this feature, the interlayer insulating film made of an oxide film or the like is polished at a selective polish rate higher than that of the stopper layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Embodiment 1

Figure 1A:
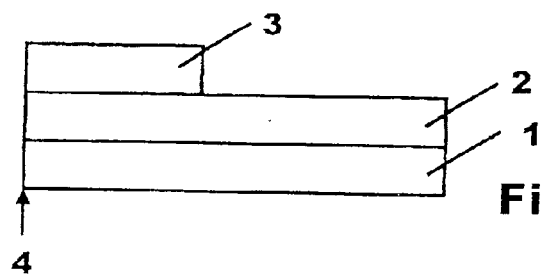
FIGS. 1(*a*) to 1(*f*) are sections illustrating the steps of manufacturing a semiconductor device according to the present invention.
Figure 1B:
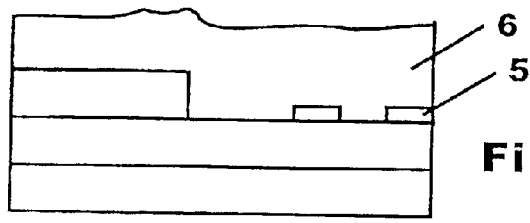
Figure 1C:
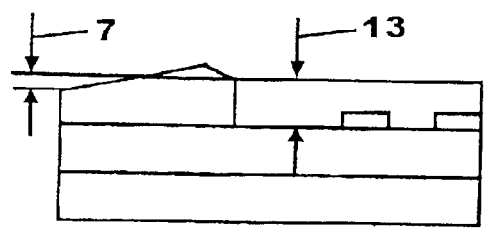
Figure 1D:
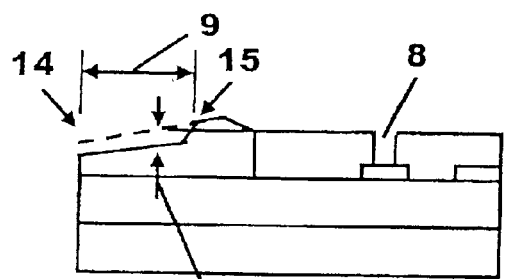
Figure 1E:
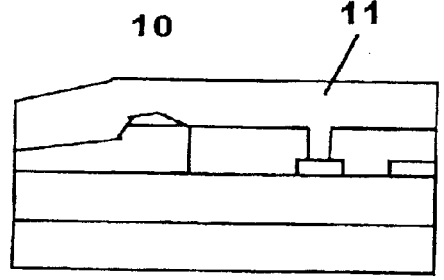
Figure 1F:
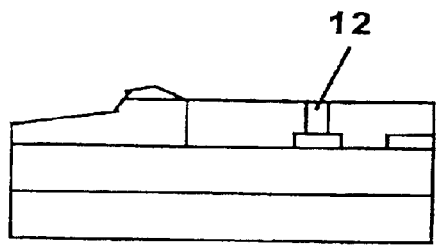

An embodiment of the present invention will be explained with reference to sections of FIGS. 1(*a*) to 1(*f*) illustrating the steps of manufacturing the semiconductor device of the present invention in the order of occurrence.

First, a first insulating film 2 is formed on a substrate 1 on which desired semiconductor devices are formed. A silicon nitride film 3 is deposited thereon and then removed by a common photolithography and dry etching such that it remains only in the neighborhood of a wafer edge 4. In other words, the silicon nitride film 3 is formed in the neighborhood of the wafer edge 4 to have a certain width as shown in FIG. 1(*a*). Then, on the first insulating film 2, a lower wiring layer 5 and a second interlayer insulating film 6 which is made of silicon oxide are deposited as shown in FIG. 1(*b*), followed by CMP for flattening the second interlayer insulating film 6. The flattened second interlayer insulating film is shown in FIG. 1(*c*).

During CMP for flattening the second interlayer insulating film 6, the silicon nitride film 3 is also polished in a region in the neighborhood of the wafer edge where the polish rate is high. However, since the polish rate of the silicon nitride film 3 is far lower than that of the interlayer insulating film made of silicon oxide, a polish amount 7 of the silicon nitride film 3 is very small.

Then, common photolithography and dry etching are performed to form a connection hole 8 as shown in FIG. 1(*d*). In this step, the second interlayer insulating film 6 remaining through the preceding CMP is removed by dry etching from a region 9 in the neighborhood of the wafer edge 4 where a resist layer has been removed. However, since the etching rate of the silicon nitride film is much smaller than that of the interlayer insulating film made of silicon oxide, a removal amount 10 of the silicon nitride film 3 is very small. Thus, the interlayer insulating film with excellent thickness uniformity in the neighborhood of the wafer edge 4 is obtained.

Then, a conductive film 11 such as a tungsten film is deposited by CVD on the entire surface as shown in FIG. 1(*e*). In order to improve the adhesion between the interlayer insulating film and the conductive film, a titanium nitride film or the like may be deposited in advance of the conductive film 11.

Thereafter, the conductive film 11 is removed from the surfaces of the second interlayer insulating film 6 and the conductive film 11 on the silicon nitride film 3 by CMP, thereby forming a connection plug 12 as shown in FIG. 1(*f*). Since the removal amount 10 of the silicon nitride film 3 in the CMP step is very small, the conductive film 11 is prevented from remaining on the silicon nitride film 3.

According to the above-mentioned steps, the interlayer insulating film having improved thickness uniformity between the neighborhood of the wafer edge 4 and other portion is provided. Further, a semiconductor device is obtained without generating remains of the conductive film 5 used for burying the connection hole in the neighborhood of the wafer edge 4.

Hereinafter, explanation is given to CMP of the second interlayer insulating film 6 using a polish agent containing silicon oxide based polish particles. This is an exemplary way of improving the thickness uniformity of the interlayer insulating film in the neighborhood of the wafer edge 4.

Figure 3:
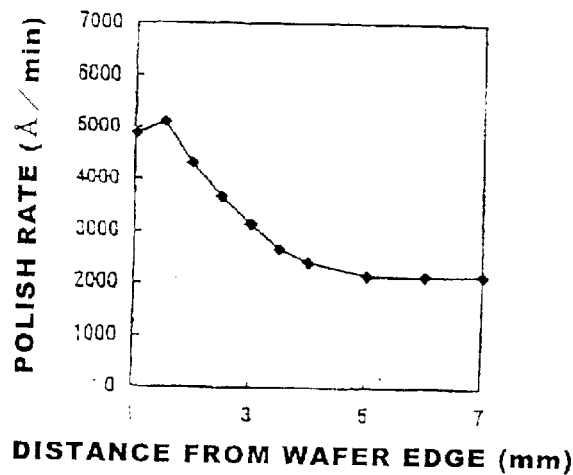
FIG. 3 is a graph illustrating a polish rate in the neighborhood of a wafer edge during CMP.

FIG. 3 shows the variation in polish rate of the interlayer insulating film depending on a distance (mm) from the wafer edge 4, wherein the polish rate varies within the range from about 2000 Å/min to about 5000 Å/min at the maximum.

Figure 4:
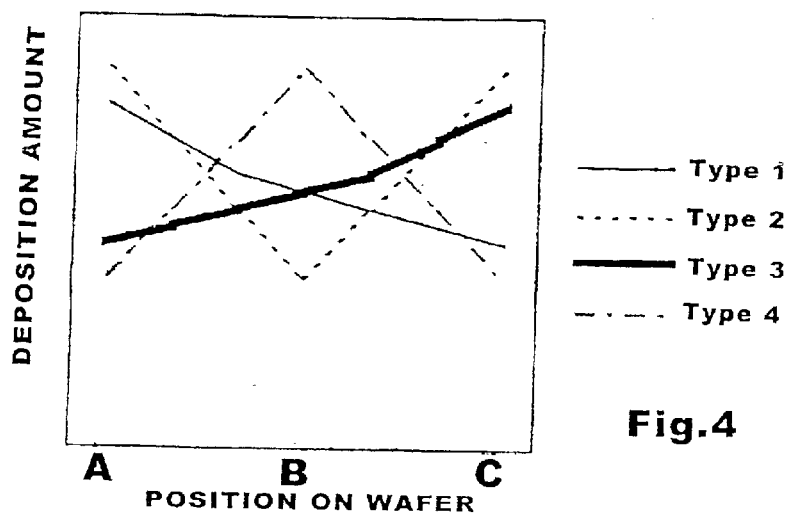
FIG. 4 is a graph illustrating a deposition amount of an interlayer insulating film.

The second insulating film 6 is flattened at the above-mentioned polish rate. For example, if the second insulating film 6 is deposited at the deposition amount in accordance with type 1 or 4 of FIG. 4, the thickness thereof is about 20000 Å at the center portion (A or B) and about 18000 Å at the wafer edge 4. Considering that the polish rate at the center portion is about 2000 Å/min and the maximum polish rate at the wafer edge is about 5000 Å/min, the polishing needs to be carried out for about 5 minutes to flatten the second interlayer insulating film 6 to an intended thickness, e.g., 10000 Å at the center portion. At the wafer edge, however, the second insulating film 6 is completely polished away, and thus the first insulating film 2 is also polished.

To prevent the excessive polishing of the second interlayer insulating film in the neighborhood of the wafer edge 4, the silicon nitride film 3 is deposited in advance by CVD and subjected to common photolithography and dry etching such that it remains only in a region of about 3–4 mm width from the wafer edge 4, and then the second interlayer insulating film 6 is deposited. If the silicon nitride film 3 is deposited to about 2000 Å, it is polished by a polish amount 7 of 1750 Å in a region where the polish rate is the highest. As a result, the thickness of the silicon nitride film 3 is reduced to about 250 Å.

Then, the connection hole 8 is formed by common photolithography and dry etching. Generally, in the photolithography step, a resist that is spin-coated on the entire wafer surface is removed from a wafer periphery portion of about 3–4 mm width from the wafer edge 4 to prevent the resist from flowing to the rear surface of the wafer during its transfer and to remove the resist applied on the side surface of the wafer. The dry etching may be carried out by using $C_4F_8$ gas or $C_2F_6$ gas and argon gas of 5 ml, a bias output of 1600 W and a source output of 1800 W. Under such conditions, the silicon nitride film is reduced at about 600 Å/min, whereas the silicon oxide film is reduced at about 9000 Å/min. If the silicon nitride film 3 is not provided, the first interlayer insulating film 2 is also polished in the neighborhood of the wafer edge 4 where the polish rate is the maximum. Additionally, since the resist layer has been removed from the wafer periphery portion, the etching further proceeds in the neighborhood of the wafer edge 4. Where the silicon nitride film 3 is provided, the removal amount 10 of the silicon nitride film 3 is about 700 Å at the maximum in a region 14 and about 50 Å at the minimum in a region 15.

In the above-described case, total of the polish amount 7 and the removal amount 10 of the silicon nitride film 3 is about 700 Å at the maximum in the region 14 and about 50 Å at the minimum in the region 15. Accordingly, by depositing the silicon nitride film 3 to have a thickness greater than an intended thickness 13 of the second interlayer insulating film 6 to be obtained after CMP by about 50 to 700 Å, the thickness of the silicon nitride film 3 to be finally obtained in the neighborhood of the wafer edge 4 is adjusted to substantially equal to the intended thickness 13 of the second interlayer insulating film 6.

According to the present invention, the silicon nitride film 3 is formed in the neighborhood of the wafer edge 4.

Therefore, in the later step of removing the conductive film 11 by CMP, the conductive film 11 does not remain on an excessively polished portion of the interlayer insulating film in the neighborhood of the wafer edge 4, and thus the generation of an undesired object is prevented in the succeeding steps.

Even if the second interlayer insulating film 6 is polished and etched at the polish rate and the etching rate different from those mentioned above, the thickness of the silicon nitride film 3 can be adjusted by estimating a thickness thereof to be reduced through the CMP step for flattening and the etching step for forming the connection hole,.such that the silicon nitride film 3 is deposited to have a thickness of a sum of the intended thickness 13 of the second interlayer insulating film 6 and the estimated reduction thickness.

In the above explanation, the silicon nitride film 3 is deposited after the first insulating film 2 is deposited. However, the silicon nitride film 3 may be deposited after the second interlayer insulating film 6 is deposited.

Figure 2:
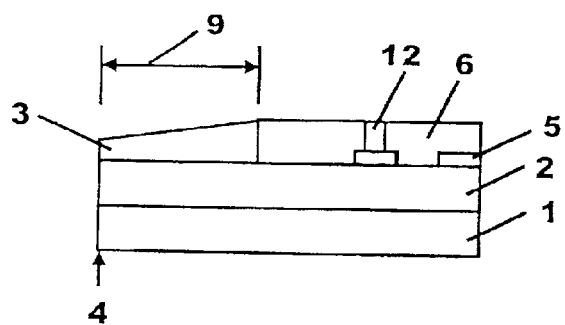
FIG. 2 is an enlarged view illustrating one of the steps of manufacturing the semiconductor device according to the present invention.

As shown in FIG. 2, the silicon nitride film 3 may be formed to have the same size as that of a periphery region 9 from which the resist layer for the photolithography is removed. In the etching step for forming the connection hole, the second interlayer insulating film 6 is removed from a region on the silicon nitride film 3 but remains on the other region where the silicon nitride film 3 is not formed. Therefore, the interlayer insulating film having excellent thickness uniformity is formed in this region. However, since it is not easy to form the silicon nitride film 3 of exactly the same size as that of the periphery region 9, the silicon nitride film 3 may be formed to have a size slightly greater than that of the periphery region 9.

The substrate used in the present invention may be any substrate generally used for manufacturing the semiconductor device. Examples thereof include a glass substrate, a plastic substrate, a semiconductor substrate and a semiconductor wafer. Specifically, may be used are an element semiconductor substrate (silicon, germanium or the like), a compound semiconductor substrate (GaAs, ZnSe, silicon germanium or the like), a SOI substrate, a SOS substrate, an element semiconductor wafer (silicon or the like) a quartz substrate, and a plastic substrate (polyethylene, polystyrene, polyimide or the like).

Embodiment 2

Figure 5A:
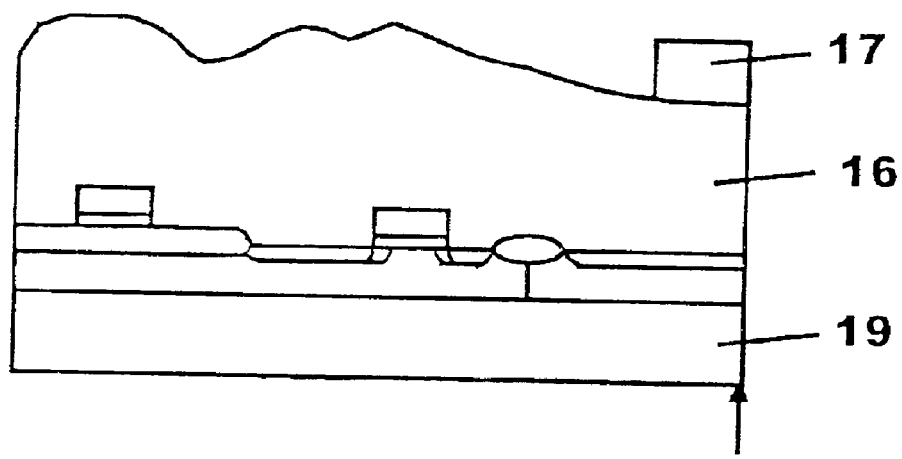
FIGS. 5(*a*) to 5(*c*) are sections illustrating the steps of manufacturing the semiconductor device according to the present invention.
Figure 5B:
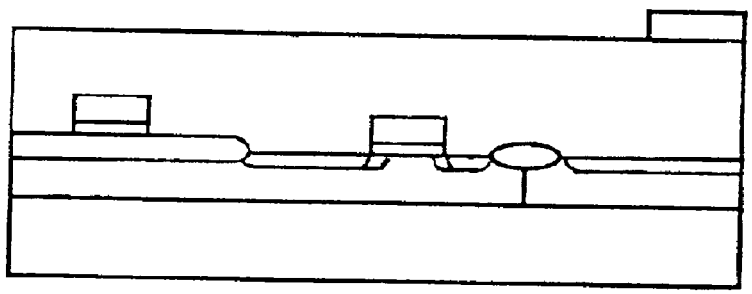
Figure 5C:
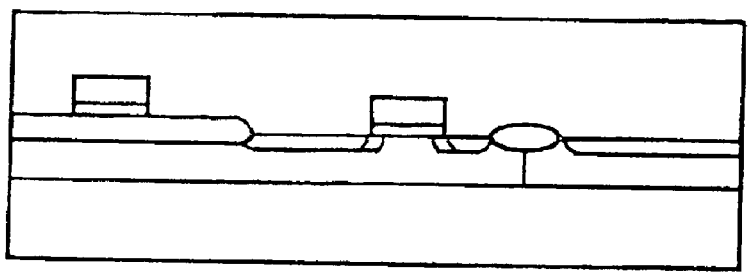
Figure 6A:
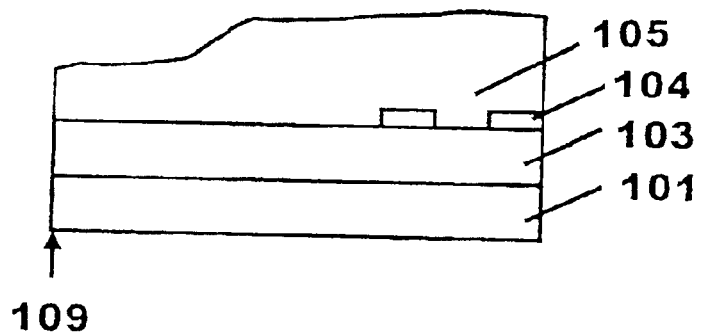
FIGS. 6(*a*) to 6(*d*) are sections illustrating the steps of manufacturing a conventional semiconductor device.
Figure 6B:
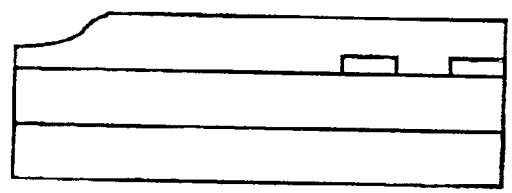
Figure 6C:
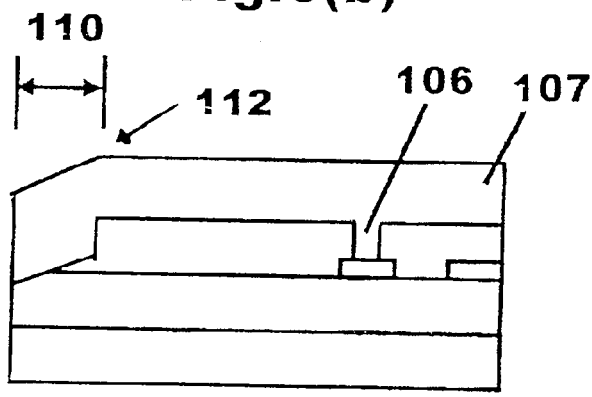
Figure 6D:
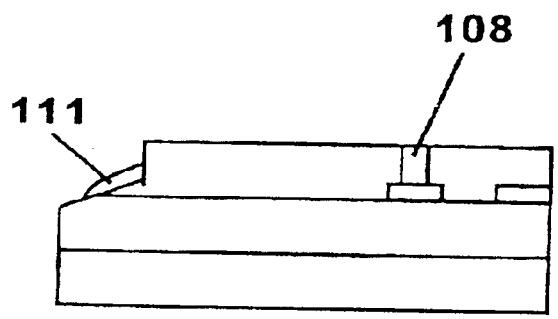
Figure 7A:
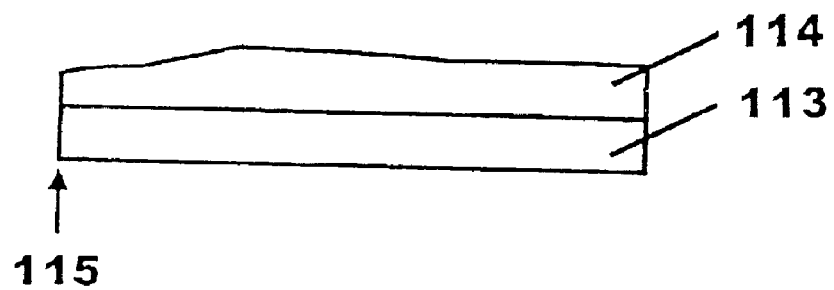
FIGS. 7(*a*) and 7(*b*) are sections illustrating the steps of manufacturing another conventional semiconductor device.
Figure 7B:
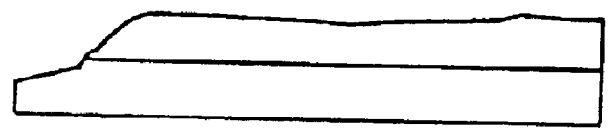
Figure 8:
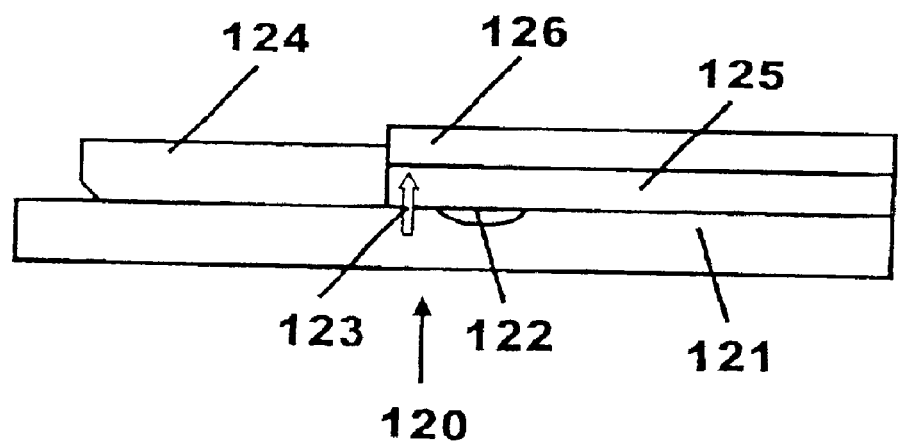
FIG. 8 is an enlarged view of the neighborhood of the wafer edge during the polishing step.

FIGS. 5(*a*) to 5(*c*) are sections illustrating a semiconductor device according to the present invention. In FIG. 5(*a*), a BPSG film which serves as an interlayer insulating film 16 is deposited by CVD on a substrate 19 on which transistors and the like are formed. Then, a silicon nitride film which serves as a stopper layer 17 is deposited to have a width of 3 mm from a wafer edge 18 where the polish rate under CMP is extremely high (see FIG. 2).

Then, CMP is performed for flattening as shown in FIG. 5(*b*). At this time, the substrate 19 is prevented from being exposed because the silicon nitride film has been formed in the neighborhood of the wafer edge 18 where the polish rate is extremely high.

As shown FIG. 5(*c*), the silicon nitride film is then removed by wet etching using phosphoric acid, thereby the interlayer insulating film 16 having a flat surface is obtained.

The kinds and deposition amounts of the interlayer insulating film 16 and the stopper layer 17 are not particularly limited. The deposition amount of the stopper layer is suitably adjusted from the deposition amounts and the polish rates under CMP of the stopper layer 17 and the insulating film 16 such that the substrate is not exposed.

The substrate used in the present invention may be any substrate generally used for manufacturing the semiconductor device. Examples thereof include a glass substrate, a plastic substrate, a semiconductor substrate and a semiconductor wafer. Specifically, may be used are an element semiconductor substrate (silicon, germanium or the like), a compound semiconductor substrate (GaAs, ZnSe, silicon germanium or the like), a SOI substrate, a SOS substrate, an element semiconductor wafer (silicon or the like), a quartz substrate, and a plastic substrate (polyethylene, polystyrene, polyimide or the like).

In the above-mentioned embodiments, the CVD step for forming the interlayer insulating film is carried out by using a CVD apparatus capable of forming a film on the entire surface of the wafer. However, the present invention is also applicable to the case where the wafer is fixed with a ring or the like at a wafer periphery portion of about several mm width from the wafer edge and thus the film is not formed on the wafer periphery portion.

According to the present invention, the polishing of the wafer periphery portion at an excessively high polish rate during CMP is prevented by depositing the stopper layer such as a silicon nitride film in the wafer periphery portion, thereby avoiding the generation of an undesired object on the wafer.

Further, in the step of dry etching for forming the connection hole, the silicon nitride film serves as the stopper layer in the wafer periphery portion where the resist is not deposited, and thus the reduction in thickness of the interlayer insulating film is prevented.

What is claimed is:

1. A process of manufacturing a semiconductor device, the process comprising:
    forming elements on a wafer, and thereafter forming an interlayer insulating film on the wafer over at least the elements;
    flattening the interlayer insulating film formed by chemical mechanical polishing,
    wherein a stopper layer is formed only at an edge region of the device so that no layer portion deposited along with the stopper layer remains on the device during the chemical mechanical polishing of the interlayer insulating film at any location other than as part of the stopper layer at the edge region of the device, the stopper layer preventing the interlayer insulating film from being excessively polished by the chemical mechanical polishing at the edge region of the device compared to a remainder of the interlayer insulating film,
    wherein the stopper layer is formed before or after forming the interlayer insulating film.

2. A process according to claim 1, wherein the stopper layer has a thickness greater than thickness of the interlayer insulating film to be obtained in the final product.

3. A process according to claim 1 further comprising the step of photolithography for forming a connection hole in the interlayer insulating film, wherein the stopper layer has a width greater than that of a resist layer to be removed from a wafer periphery portion in the photolithography step.

4. A process according to claim 1, wherein the stopper layer comprises silicon nitride.

5. A process according to claim 1, wherein the interlayer insulating film comprises silicon oxide.

6. A process according to claim 3, wherein the width of the resist layer to be removed from the wafer periphery portion is 3–4 mm.

7. A process according to claim 1, wherein the stopper layer is removed after the chemical mechanical polishing.

8. A process according to claim 2, wherein the stopper layer has a thickness greater than the thickness of the interlayer insulating film in the final product by 50–700 Å.

9. A method of making a semiconductor device, the method comprising:
    forming elements to be at least partially supported by a substrate,
    forming a stopper layer so that the stopper layer is located at an edge portion of the device but not at any central portion of the device located proximate a center of the device,
    forming an interlayer insulating film over at least the elements and the stopper layer;
    chemical mechanical polishing the interlayer insulating film so as to remove the interlayer insulating film over the stopper layer, wherein a polishing rate of the interlayer insulating film is greater than a polishing rate of the stopper layer,
    wherein no layer portion deposited along with the stopper layer remains on the device during the chemical mechanical polishing of the interlayer insulating film at any location other than as part of the stopper layer at the edge portion of the device, and
    wherein the stopper layer prevents the interlayer insulating film from being excessively polished at the edge portion of the device compared to a remainder of the interlayer insulating film.

10. A method of making a semiconductor device, the method comprising:
    forming elements on a substrate,
    forming an interlayer insulating film over at least the elements;
    forming a stopper layer over only an edge portion of the interlayer insulating film so that the stopper layer is located at an edge portion of the device but not at any central portion of the device proximate a center of the device;
    chemical mechanical polishing the interlayer insulating film and the stopper layer, wherein a polishing rate of the interlayer insulating film is greater than a polishing rate of the stopper layer, so that the interlayer insulating film is prevented from being excessively polished at the edge portion of the device compared to a remainder of the interlayer insulating film not located at the edge portion of the device; and
    after the chemical mechanical polishing, removing the stopper layer from the edge portion of the interlayer insulating film so as to expose a portion of the interlayer insulating film that had previously been under the stopper layer.

11. The process of claim 1, wherein the stopper layer is formed before the interlayer insulating film.

12. The process of claim 1, wherein the stopper layer is formed after and over the interlayer insulating film so as to contact an upper surface of the interlayer insulating film.

13. The process of claim 1, wherein the edge region of the device is an edge region of the wafer.

14. The process of claim 10, wherein the edge region of the device is an edge region of a wafer.

* * * * *